(12) United States Patent
Ito

(10) Patent No.: US 11,818,885 B2
(45) Date of Patent: Nov. 14, 2023

(54) SEMICONDUCTOR MEMORY DEVICE

(71) Applicant: Kioxia Corporation, Minato-ku (JP)

(72) Inventor: Takamasa Ito, Nagoya (JP)

(73) Assignee: Kioxia Corporation, Minato-ku (JP)

( * ) Notice: Subject to any disclaimer, the term of this patent is extended or adjusted under 35 U.S.C. 154(b) by 290 days.

(21) Appl. No.: 16/798,577

(22) Filed: Feb. 24, 2020

(65) Prior Publication Data

US 2021/0082933 A1    Mar. 18, 2021

(30) Foreign Application Priority Data

Sep. 17, 2019  (JP) .................................. 2019-168704

(51) Int. Cl.
```
H10B 43/27      (2023.01)
H10B 41/27      (2023.01)
G11C 5/06       (2006.01)
G11C 5/02       (2006.01)
```

(52) U.S. Cl.
CPC ............ *H10B 41/27* (2023.02); *G11C 5/025* (2013.01); *G11C 5/06* (2013.01); *H10B 43/27* (2023.02)

(58) Field of Classification Search
None
See application file for complete search history.

(56) References Cited

U.S. PATENT DOCUMENTS

| | | | |
|---|---|---|---|
| 2010/0109071 A1 | 5/2010 | Tanaka et al. | |
| 2011/0291172 A1* | 12/2011 | Hwang | H01L 29/66833 257/314 |
| 2018/0366483 A1* | 12/2018 | Choi | H01L 27/11524 |
| 2019/0172906 A1* | 6/2019 | Kim | H01L 27/11573 |
| 2021/0159238 A1* | 5/2021 | Xia | G11C 5/04 |

FOREIGN PATENT DOCUMENTS

| | | |
|---|---|---|
| CN | 106611745 A | 5/2017 |
| CN | 107017260 A | 8/2017 |
| CN | 109148472 A | 1/2019 |
| JP | 2010-114113 A | 5/2010 |
| TW | 201021201 A1 | 6/2010 |
| TW | I671878 B | 9/2019 |

* cited by examiner

*Primary Examiner* — Sarah K Salerno
(74) *Attorney, Agent, or Firm* — Oblon, McClelland, Maier & Neustadt, L.L.P.

(57) ABSTRACT

According to an embodiment, a semiconductor memory device includes a first conductive layer and second conductive layers arranged at intervals in a first direction above the first conductive layer. A semiconductor layer extends in the first direction in the second conductive layers to be in contact with the first conductive layer. A charge storage layer is between the semiconductor layer and the second conductive layers. A metal layer extends in the first direction and a second direction above the first conductive layer, and separates the second conductive layers. The device further includes an insulating layer. The insulating layer includes a portion between the metal layer and the first conductive layer and a portion between the metal layer and the second conductive layers.

16 Claims, 15 Drawing Sheets

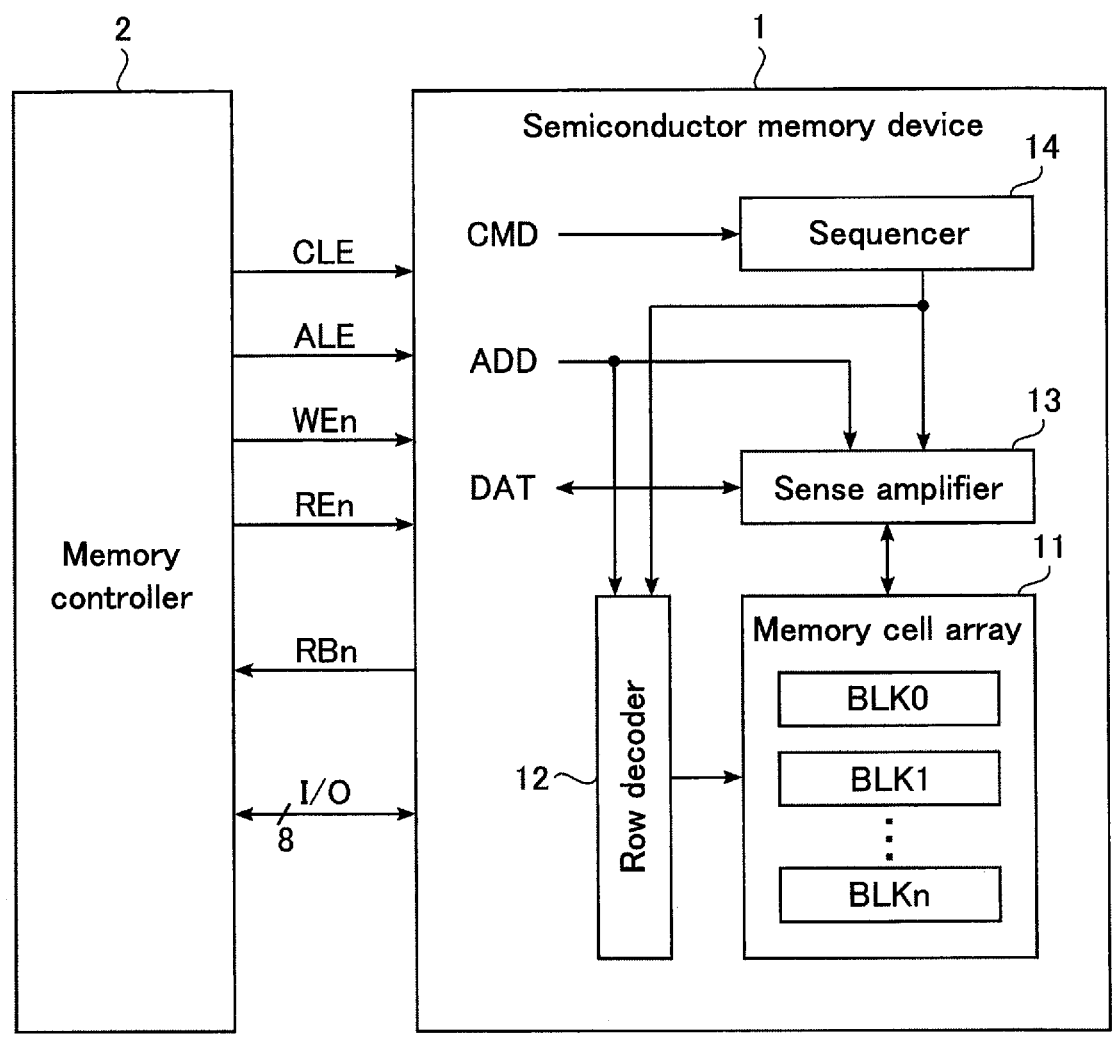
F I G. 1

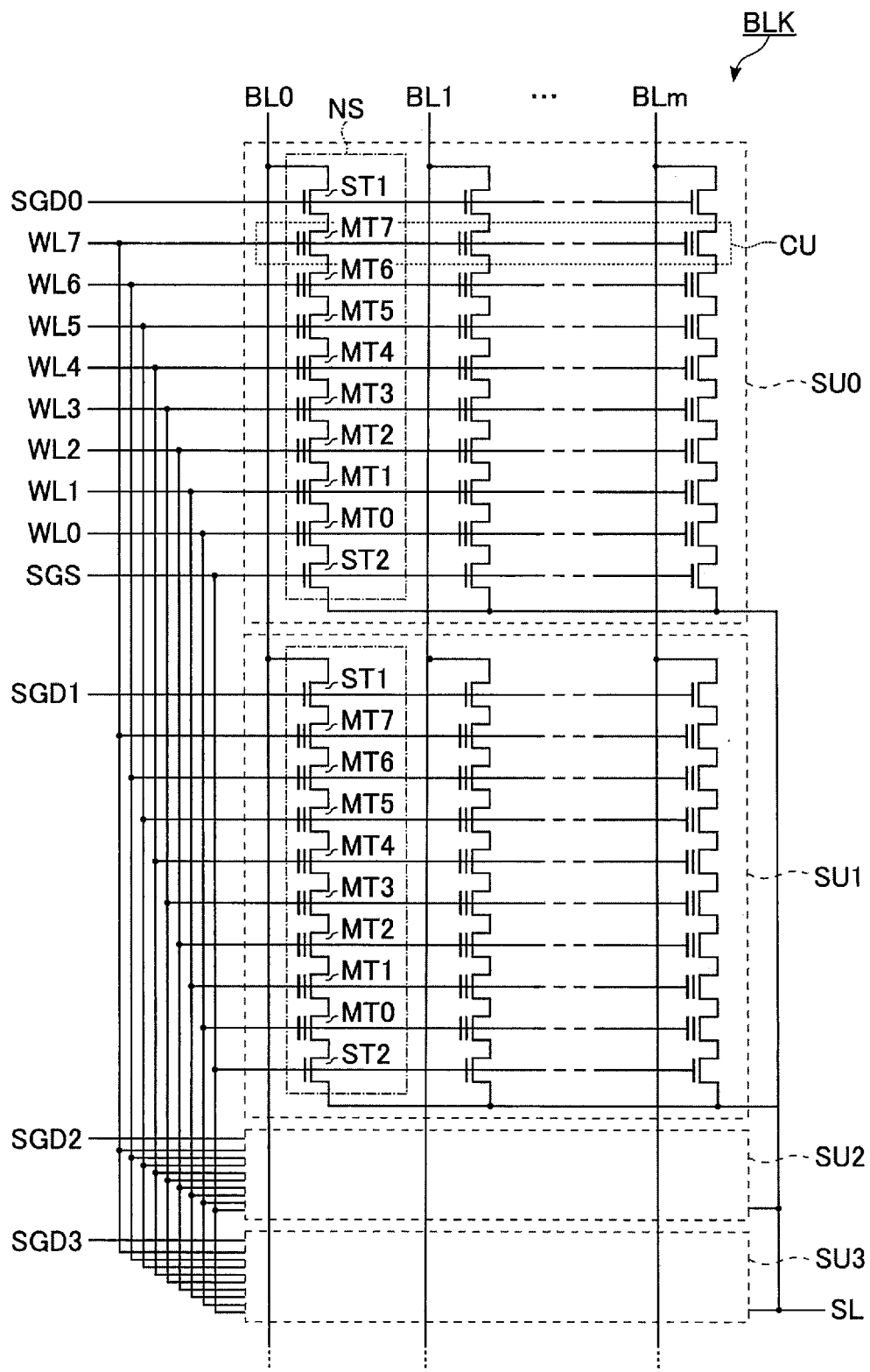
F I G. 2

SEMICONDUCTOR MEMORY DEVICE

CROSS-REFERENCE TO RELATED APPLICATIONS

This application is based upon and claims the benefit of priority from Japanese Patent Application No. 2019-168704, filed Sep. 17, 2019, the entire contents of which are incorporated herein by reference.

FIELD

Embodiments described herein relate generally to a semiconductor memory device.

BACKGROUND

A NAND flash memory in which memory cells are three-dimensionally arranged has been known.

BRIEF DESCRIPTION OF THE DRAWINGS

FIG. 1 is a block diagram showing an example of a configuration of a semiconductor memory device according to a first embodiment.

FIG. 2 shows an example of a circuit configuration of a memory cell array of the semiconductor memory device according to the first embodiment.

DETAILED DESCRIPTION

Figure 3:
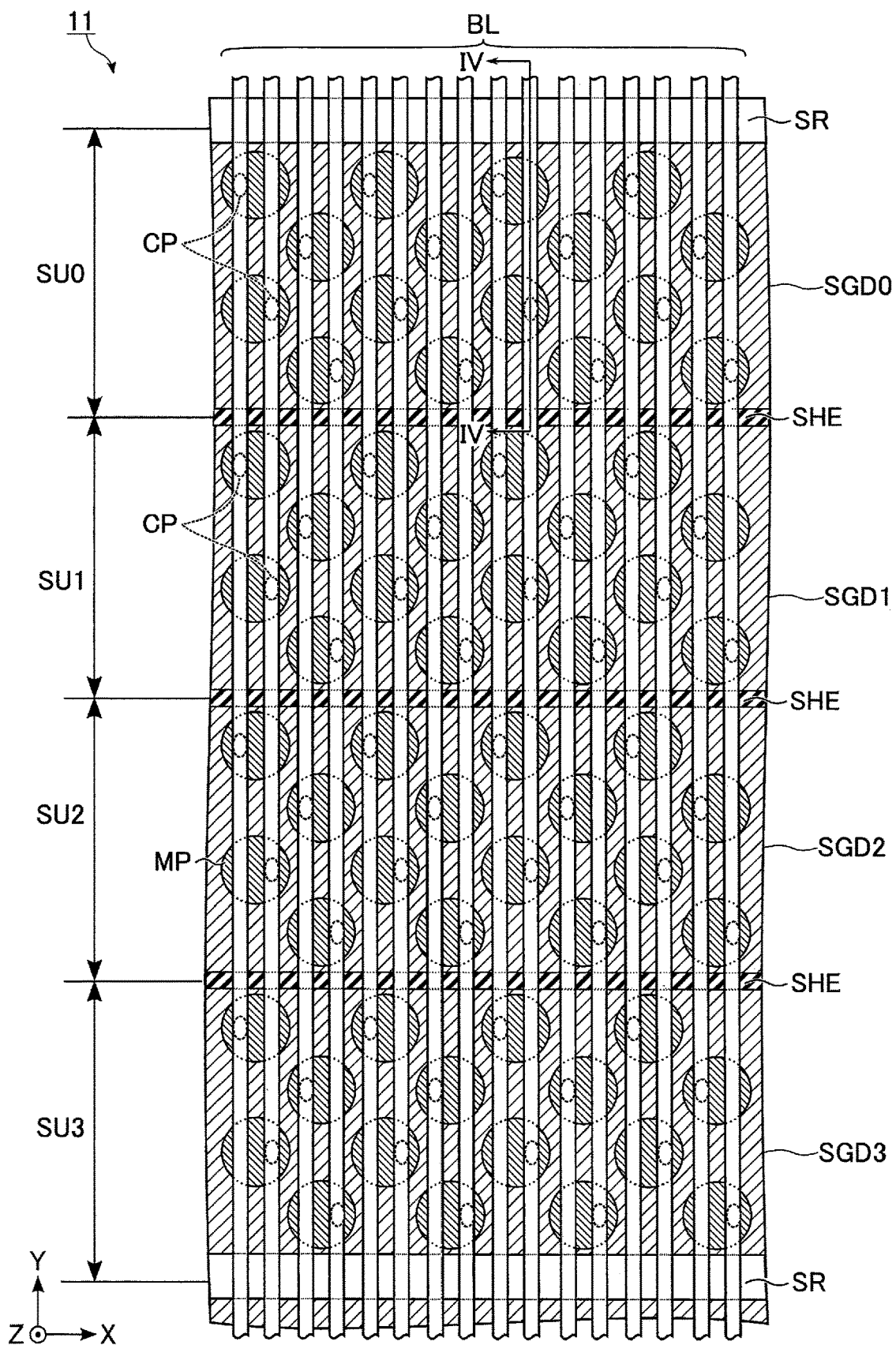
FIG. 3 is a plan view of the memory cell array in the semiconductor memory device according to the first embodiment, as viewed from above.

In general, according to an embodiment, a semiconductor memory device includes a first conductive layer and a plurality of second conductive layers arranged at intervals in a first direction above the first conductive layer. A first semiconductor layer extends in the first direction in the second conductive layers so as to be in contact with the first conductive layer. A charge storage layer is arranged between the first semiconductor layer and the second conductive layers. A metal layer extends in the first direction and a second direction intersecting the first direction above the first conductive layer, and separates the second conductive layers in a third direction intersecting the first direction and the second direction. The device further includes a first insulating layer. The first insulating layer includes a first portion arranged between the metal layer and the first conductive layer and a second portion arranged between the metal layer and the second conductive layers.

Embodiments will be described with reference to the accompanying drawings. In the description that follows, components having the same functions and configurations will be denoted by a common reference symbol. When multiple components with a common reference symbol need to be distinguished from one another, different suffixes are added to the common reference symbol to make such distinctions. When multiple components need not be particularly distinguished from one another, the multiple components are denoted only by the common reference symbol, without the addition of a suffix.

First Embodiment

Hereinafter, a semiconductor memory device 1 according to a first embodiment will be described.

Configuration Example (1) Semiconductor Memory Device

FIG. 1 is a block diagram showing an example of a configuration of the semiconductor memory device 1 according to the first embodiment. The semiconductor memory device 1 is, for example, a NAND flash memory capable of storing data in a non-volatile manner, and is controlled by an external memory controller 2.

The semiconductor memory device 1 includes a memory cell array 11 and peripheral circuitry. The peripheral circuitry includes a row decoder 12, a sense amplifier 13, and a sequencer 14.

The memory cell array 11 includes a plurality of blocks BLK0 to BLKn (where "n" is an integer equal to or greater than 1). Each block BLK includes a plurality of non-volatile memory cells each associated with a bit line and a word line, and constitutes, for example, a unit of data erasure.

The row decoder 12 selects a block BLK based on address information ADD received by the semiconductor memory device 1 from the memory controller 2. The row decoder 12 transfers a voltage to each of the word lines in the selected block BLK.

The sense amplifier 13 performs an operation to transfer data DAT between the memory controller 2 and the memory cell array 11, based on the address information ADD received by the semiconductor memory device 1 from the memory controller 2. That is, in a write operation, the sense amplifier 13 retains write data DAT received by the semiconductor memory device 1 from the memory controller 2, and applies a voltage to each of the bit lines based on the retained write data DAT. In a read operation, the sense amplifier 13 applies a voltage to each of the bit lines, reads data stored in the memory cell array 11 as read data DAT, and outputs the read data DAT to the memory controller 2.

The sequencer 14 controls the entire operation of the semiconductor memory device 1 based on a command CMD received by the semiconductor memory device 1 from the memory controller 2. For example, the sequencer 14 executes various operations such as a write operation and a read operation, through control of the row decoder 12, the sense amplifier 13, etc.

Communications between the semiconductor memory device 1 and the memory controller 2 support, for example, NAND interface standards. The communications between the semiconductor memory device 1 and the memory controller 2 are performed using, for example, a command latch enable signal CLE, an address latch enable signal ALE, a write enable signal WEn, a read enable signal REn, a ready/busy signal RBn, and an input/output signal I/O. The input/output signal I/O is, for example, an 8-bit signal, and may contain a command CMD, address information ADD, data DAT, etc.

The command latch enable signal CLE is a signal used to indicate that the input/output signal I/O received by the semiconductor memory device 1 is a command CMD. The address latch enable signal ALE is a signal used to indicate that the input/output signal I/O received by the semiconductor memory device 1 is address information ADD. The write enable signal WEn is a signal used to instruct the semiconductor memory device 1 to input the input/output signal I/O. The read enable signal REn is a signal used to instruct the semiconductor memory device 1 to output the input/output signal I/O. The ready/busy signal RBn is a signal used to notify the memory controller 2 of whether the semiconductor memory device 1 is in a ready state in which the semiconductor memory device 1 is ready to receive an instruction from the memory controller 2, or in a busy state in which the semiconductor memory device 1 is not ready to receive an instruction.

The above-described semiconductor memory device 1 and memory controller 2 may be combined into a single semiconductor memory device. Examples of such semiconductor memory devices include a memory card such as an SD™ card, a solid state drive (SSD), etc.

(2) Memory Cell Array

FIG. 2 shows an example of a circuit configuration of a memory cell array 11 in the semiconductor memory device 1 according to the first embodiment. In FIG. 2, an example of a circuit configuration of one of a plurality of blocks BLK included in the memory cell array 11 is shown, as an example of a circuit configuration of the memory cell array 11. Each of the blocks BLK included in the memory cell array 11 has, for example, the circuit configuration shown in FIG. 2.

As shown in FIG. 2, the block BLK includes, for example, four string units SU0 to SU3. Each of the string units SU includes a plurality of NAND strings NS. Each NAND string NS is coupled to a corresponding bit line BL, of a plurality of bit lines BL0 to BLm (where "m" is an integer of 1 or greater), and includes, for example, memory cell transistors MT0 to MT7 and select transistors ST1 and ST2. Each of the memory cell transistors MT includes a control gate (hereinafter also referred to as a "gate") and a charge storage layer, and stores data in a non-volatile manner. The select transistors ST1 and ST2 are used in various operations to select the NAND string NS that includes the select transistors ST1 and ST2.

A drain of the select transistor ST1 of each of the NAND strings NS is coupled to the corresponding bit line BL. The memory cell transistors MT0 to MT7 are coupled in series between a source of the select transistor ST1 and a drain of the select transistor ST2. A source of the select transistor ST2 is coupled to a source line SL.

Gates of select transistors ST1 of NAND strings NS included in the same string unit SUj are commonly coupled to a select gate line SGDj. In the example of FIG. 2, "j" is an integer from 0 to 3. Gates of select transistors ST2 of NAND strings NS included in the same block BLK are commonly coupled to a select gate line SGS. Gates of memory cell transistors MTk of NAND strings NS included in the same block BLK are commonly coupled to a word line WLk. In the example of FIG. 2, "k" is an integer from 0 to 7.

Each bit line BL is coupled to drains of select transistors ST1 of the respective NAND strings NS included in a plurality of string units SU. The source line SL is shared among the string units SU.

A group of memory cell transistors MT commonly coupled to a word line WL in a string unit SU is referred to as, for example, a "cell unit CU". Data consisting of same-order single bits stored in the respective memory cell transistors MT in a cell unit CU is referred to as, for example, "1-page data".

A circuit configuration of the memory cell array 11 has been described as above; however, the circuit configuration of the memory cell array 11 is not limited thereto. For example, the number of string units SU included in each block BLK may be designed to be any number. Moreover, each of the numbers of memory cell transistors MT and select transistors ST1 and ST2 included in each NAND string NS may be designed to be any number. The numbers of word lines WL and select gate lines SGD and SGS may be changed based on the numbers of memory cell transistors MT and select transistors ST1 and ST2 in the NAND string NS.

(3) Structure of Semiconductor Memory Device

A structure of the semiconductor memory device 1 according to the first embodiment will be described with reference to the drawings. The structure of the semiconductor memory device 1 illustrated in the drawings, to which reference will be made, is merely an example, and the structure of the semiconductor memory device 1 is not limited thereto. For example, when an object B is described as being provided on an upper surface of an object A, with reference to a drawing illustrating the object A and the object B in contact with each other, one or more other objects may be interposed between the object A and the object B, unless otherwise explicitly stated.

The semiconductor memory device 1 includes a semiconductor substrate. The semiconductor substrate contains, for example, silicon (Si). Two directions that are parallel to a surface of the semiconductor substrate and orthogonal to each other, for example, are defined as an "x direction" and a "y direction", and a direction which is orthogonal to the surface and in which the memory cell array 11 is formed, for example, is defined as a "z direction". In the description that follows, the z direction is assumed to be upward, and the direction opposite to the z direction is assumed to be downward; however, these assumptions are merely for convenience, and are irrelevant to, for example, the direction of gravitational force.

FIG. 3 shows an example of a planar layout of components of the structure of the memory cell array 11 of the semiconductor memory device 1 according to the first embodiment, as viewed from above. This planar layout corresponds to part of the string units SU0 to SU3 of a block BLK. Blocks BLK other than the block BLK to be described below may have structures equivalent to the structure illustrated in the planar layout.

The memory cell array 11 includes, for example, a layer stack including a plurality of conductors stacked in the z direction with interlayer insulating films interposed therebetween, first separation regions SR, second separation regions SHE, memory pillars MP, contact plugs CP, and bit lines BL. The first separation regions SR, the second separation regions SHE, and the memory pillars MP are provided in the layer stack. The contact plugs CP and the bit lines BL are provided above the layer stack.

The conductors respectively function as, from lower to upper, a select gate line SGS, a word line WL0, a word line WL1, . . . , a word line WL7, and a select gate line SGD. Each of the conductors is provided so as to extend in a planar shape along, for example, an xy plane corresponding to the x and y directions. Of these conductors, the conductor that functions as the select gate line SGD is illustrated in FIG. 3 for easy reference. In the description to be given below with reference to FIG. 3, a "conductor" refers to the conductor that functions as the select gate line SGD, unless otherwise explicitly stated.

A first separation region SR extends in, for example, the x direction. A plurality of first separation regions SR are provided at intervals as viewed in, for example, the y direction. The first separation region SR includes, for example, an insulator, and separates the conductor. Similarly, the first separation region SR separates the conductors that respectively function as the select gate line SGS and the word lines WL0 to WL7.

A second separation region SHE extends in, for example, the x direction. In the example of FIG. 3, three second separation regions SHE are provided, between two adjacent first separation regions SR, at intervals as viewed in, for example, the y direction. The second separation region SHE includes, for example, an insulator, and separates the conductor. The width (i.e., the length in the y direction) of the second separation region SHE is smaller than the width (i.e., the length in the y direction) of the first separation region SR. The second separation region SHE is provided above the conductors that respectively function as the select gate line SGS and the word lines WL0 to WL7. Thus, the second separation region SHE does not separate the conductors that respectively function as the select gate line SGS and the word lines WL0 to WL7.

Accordingly, the first separation region SR functions as, for example, a boundary between the blocks BLK, and the second separation region SHE functions as, for example, a boundary between the string units SU. In the example of FIG. 3, the structure interposed between two first separation regions SR of the memory cell array 11 is divided into four structures each corresponding to a string unit SU, by the boundaries of the second separation regions SHE. The four structures respectively correspond to the string unit SU0, the string unit SU1, the string unit SU2, and the string unit SU3, which are arranged in this order in the direction opposite to the y direction. In the example of FIG. 3, a region of the conductor interposed between two first separation regions SR is separated by the second separation regions SHE into four regions that independently function as select gate lines SGD. The four regions respectively function as, in order of arrangement in the direction opposite to the y direction, a select gate line SGD0, a select gate line SGD1, a select gate line SGD2, and a select gate line SGD3.

The memory cell array 11 is configured, as a whole, in such a manner that a layout similar to the layout illustrated in FIG. 3 is repeatedly arranged in the x and y directions.

In the example of FIG. 3, a plurality of memory pillars MP, e.g., 16 rows of memory pillars MP are provided in a staggered manner between two adjacent first separation regions SR. In each of the structures corresponding to the string units SU0 to SU3, four rows of memory pillars MP, for example, are arranged in a staggered manner. Each memory pillar MP corresponds to, for example, a NAND string NS.

Each bit line BL extends in, for example, the y direction. A plurality of bit lines BL are provided at intervals as viewed in, for example, the x direction. Each bit line BL is provided to overlap at least one memory pillar MP in a single string unit SU, as viewed in, for example, the z direction. Two bit lines BL overlap each memory pillar MP.

A contact plug CP is provided between the memory pillar MP and one of the two bit lines BL overlapping the memory pillar MP as viewed in the z direction. The NAND string NS and the bit line BL are electrically coupled via the contact plug CP.

The planar layout of the memory cell array 11 described above is merely an example, and the planar layout of the memory cell array 11 is not limited thereto. For example, the number of second separation regions SHE arranged between adjacent first separation regions SR and the number of string units SU included in the block BLK may be freely designed. In addition, the number and arrangement of the memory pillars MP and/or the bit lines BL coupled to the memory pillars MP may be freely designed.

Figure 4:
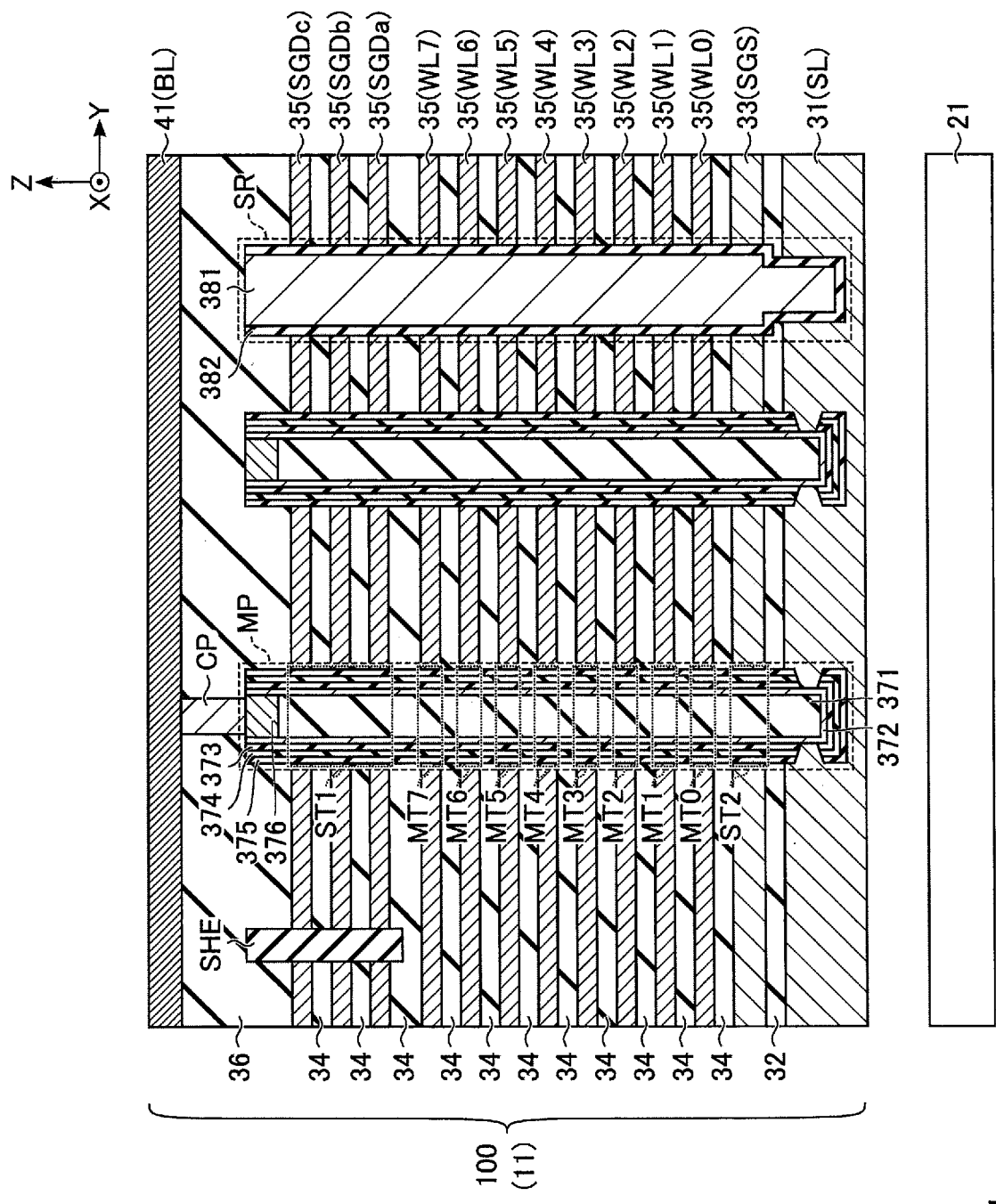
FIG. 4 is a cross-sectional view showing an example of a cross-sectional structure of the semiconductor memory device according to the first embodiment.

FIG. 4 is a cross-sectional view showing an example of a cross-sectional structure of the semiconductor memory device 1 according to the first embodiment. The cross-sectional view illustrated in FIG. 4 corresponds to a cross-sectional view of the semiconductor memory device 1 cut in the z direction along line IV-IV illustrated in FIG. 3.

The semiconductor memory device 1 includes a memory cell unit 100 provided above the semiconductor substrate (hereinafter referred to as "semiconductor substrate 21"). The memory cell array 11 is provided in the memory cell unit 100. Specifically, the memory cell transistors MT shown in FIG. 2 are three-dimensionally arranged in the memory cell unit 100. Part of the architecture of the memory cell array 11 is constituted by a layer stack including a conductor 33, insulators 34, and conductors 35, and by memory pillars MP in the layer stack. The conductors 33 and 35 respectively correspond to the conductors that function as the select gate line SGS, the word lines WL0 to WL7, and the select gate line SGD, described with reference to FIG. 3. Circuitry elements constituting the peripheral circuitry shown in FIG. 1, for example, are provided between the semiconductor substrate 21 and the memory cell unit 100.

The structure of the memory cell unit 100 will be described in detail below.

A conductor 31 is provided above the semiconductor substrate 21. The conductor 31 contains, for example, polysilicon (Si). The conductor 31 functions as a source line SL. An insulator 32 is provided on an upper surface of the conductor 31. The insulator 32 contains, for example, silicon oxide ($SiO_2$).

A conductor 33 is provided on an upper surface of the insulator 32. The conductor 33 contains, for example, polysilicon (Si). The conductor 33 functions as a select gate line SGS.

Insulators 34 and conductors 35 are alternately stacked on an upper surface of the conductor 33. In the example of FIG. 4, the insulator 34 and the conductor 35 are repeatedly stacked eleven times in this order on the upper surface of the conductor 33. The insulators 34 contain, for example, silicon oxide ($SiO_2$). The conductors 35 contain, for example, tungsten (W). The conductors 35 respectively function as, for example, in order of proximity to the semiconductor substrate 21, a word line WL0, a word line WL1, a word line WL2, . . . , a word line WL7, a select gate line SGDa, a select gate line SGDb, and a select gate line SGDc. FIG. 4 shows an example in which three conductors 35 that function as select gate lines SGD are provided, thus making the number of select transistors ST1 included in each NAND string NS three. However, the number of conductors 35 that function as the select gate lines SGD may be any other number.

Each memory pillar MP extends in, for example, the z direction through the conductors 35, the insulators 34, the conductor 33, the insulator 32, and the conductor 31. An upper end of the memory pillar MP is positioned, for example, above an upper surface of the uppermost conductor 35, and a lower end of the memory pillar MP is positioned, for example, below an upper surface of the conductor 31.

The memory pillar MP includes, for example, a core member 371, a semiconductor 372, a tunnel oxide film 373, an insulating film 374, a block insulating film 375, and a semiconductor 376. An upper end of the core member 371, formed in a pillar shape, is positioned above the upper surface of the uppermost conductor 35, and a lower end of the core member 371 is positioned below the upper surface of the conductor 31. A side surface and a lower surface of the core member 371 are covered with a semiconductor 372. An upper surface of the semiconductor 372 is positioned above an upper surface of the core member 371. A region of a side surface of the semiconductor 372 between the upper surface and a lower surface of the conductor 31 is in contact with the conductor 31. A tunnel oxide film 373, an insulating film 374, and a block insulating film 375 are provided in this order on a side surface and a lower surface of the semiconductor 372 excluding the above-mentioned region. The semiconductor 376 is provided on the upper surface of the core member 371. A side surface of the semiconductor 376 is covered with the semiconductor 372. The semiconductors 372 and 376 contain, for example, polysilicon (Si). The core member 371, the tunnel oxide film 373, and the block insulating film 375 contain, for example, silicon oxide ($SiO_2$). The insulating film 374 contains, for example, silicon nitride (SiN), and functions as a charge storage film.

A portion of the memory pillar MP that intersects the conductor 33 functions as, for example, a select transistor ST2. Portions of the memory pillar MP that intersect the conductors 35 respectively function as, for example, in order of proximity to the semiconductor substrate 21, a memory cell transistor MT0, a memory cell transistor MT1, ..., a memory cell transistor MT7, a select transistor ST1$a$, a select transistor ST1$b$, and a select transistor ST1$c$.

A pillar-shaped contact plug CP is provided on upper surfaces of the semiconductors 372 and 376. In the example of FIG. 4, a contact plug CP provided on one of the two memory pillars MP is shown. A contact plug CP is similarly provided on the other memory pillar MP, at a position away from the cross section illustrated in FIG. 4, as viewed in the x direction. An upper surface of each contact plug CP is in contact with a conductor 41 in a layer in which bit lines are provided. The conductor 41 contains, for example, copper (Cu). The conductor 41 functions as a bit line BL.

The first separation region SR extends in, for example, the z direction, so as to separate the conductors 35, the insulators 34, the conductor 33, and the insulator 32. An upper end of the first separation region SR is positioned, for example, above the upper surface of the uppermost conductor 35, and a lower end of the first separation region SR is positioned, for example, below the upper surface of the conductor 31.

The first separation region SR includes, for example, a conductor 381 and an insulating film 382. An upper end of the conductor 381 is positioned, for example, above the upper surface of the uppermost conductor 35, and a lower end of the conductor 381 is positioned, for example, below a lower surface of the conductor 33. The lower end of the conductor 381 may be positioned below the upper surface of the conductor 31. The positions of the upper and lower ends of the conductor 381 are not limited thereto, and the conductor 381 may be any structure that extends in, for example, the x and z directions in the first separation region SR. A side surface and a lower surface of the conductor 381 are covered with the insulating film 382. The conductor 381 is insulated from the conductor 31, the conductor 33, and the conductors 35 by the insulating film 382. The conductor 381 contains, for example, tungsten (W). Alternatively, the conductor 381 may contain, for example, titanium nitride (TiN). Alternatively, the conductor 381 may contain titanium (Ti) and titanium nitride (TiN). The insulating film 382 contains, for example, silicon oxide ($SiO_2$).

The second separation region SHE extends in, for example, the z direction so as to separate the uppermost three conductors 35 of the conductors 35. An upper end of the second separation region SHE is positioned above the upper surface of the uppermost conductor 35. A lower end of the second separation region SHE is positioned, for example, below a lower surface of the third uppermost conductor 35 of the conductors 35, but does not reach the fourth uppermost conductor 35 of the conductors 35. The second separation region SHE contains, for example, silicon oxide ($SiO_2$).

In the region between the uppermost conductor 35 and the layer in which the conductor 41 is provided, an interlayer insulator 36 is provided in portions in which none of the memory pillars MP, the contact plugs CP, the first separation regions SR, and the second separation regions SHE are provided. The interlayer insulator 36 contains, for example, silicon oxide ($SiO_2$).

[Manufacturing Method]

FIGS. 5 to 14 are cross-sectional views showing an example of the steps of manufacturing the semiconductor memory device 1 according to the first embodiment, corresponding to the example of FIG. 4. FIGS. 5 to 14 illustrate cross-sections cut in the same plane in the steps of manufacturing the semiconductor memory device 1. In these drawings, the portion of the semiconductor memory device 1 between a semiconductor substrate 21 and a memory cell unit 100 is omitted, as in FIG. 4, and the steps of manufacturing this portion will be omitted in the description that follows.

Figure 5:
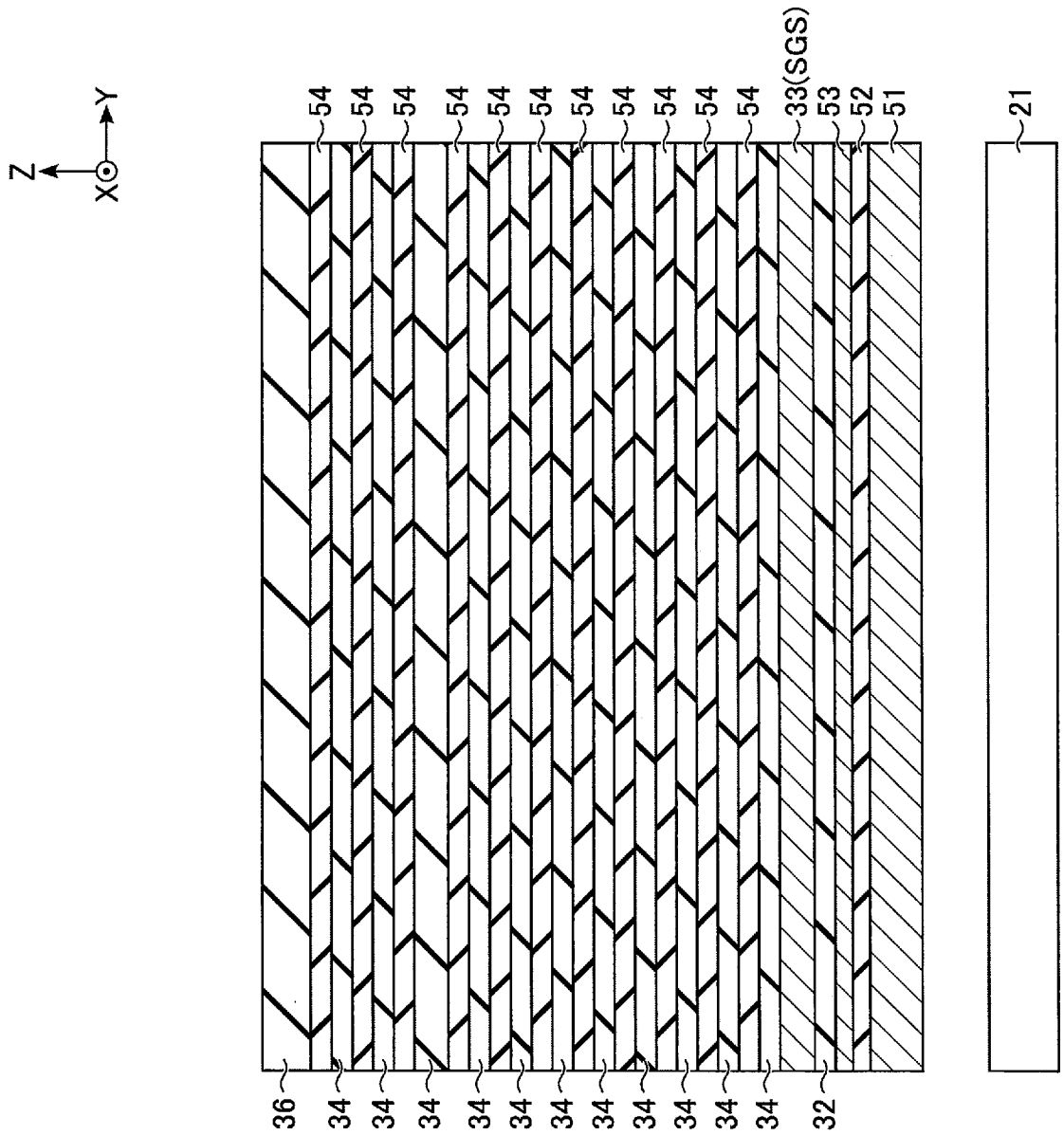
FIGS. 5 to 14 are cross-sectional views showing an example of sequential steps of manufacturing the semiconductor memory device according to the first embodiment.

First, as illustrated in FIG. 5, a conductor 51 is formed above the semiconductor substrate 21, with an insulator interposed therebetween. A replacement member (sacrificial layer) 52 is formed on an upper surface of the conductor 51. A conductor 53 is formed on an upper surface of the replacement member 52. The conductors 51 and 53 contain, for example, polysilicon (Si). A material that is etched at a greater etching rate than the etching rates of the conductors 51 and 53 in etching that allows for, for example, selective removal of the replacement member 52 is selected as the replacement member 52. An insulator 32 is formed on an upper surface of the conductor 53. A conductor 33 is formed on an upper surface of the insulator 32. Insulators 34 and replacement members 54 are alternately stacked on an upper surface of the conductor 33. In the example of FIG. 5, the insulator 34 and the replacement member 54 are repeatedly stacked eleven times in this order on the upper surface of the conductor 33. The replacement members 54 contain, for example, silicon nitride (SiN). The number of replacement members 54 to be formed corresponds to, for example, the number of word lines WL and select gate lines SGD corresponding to a NAND string NS. An insulator 36 is formed on an upper surface of the uppermost replacement member 54.

Figure 6:
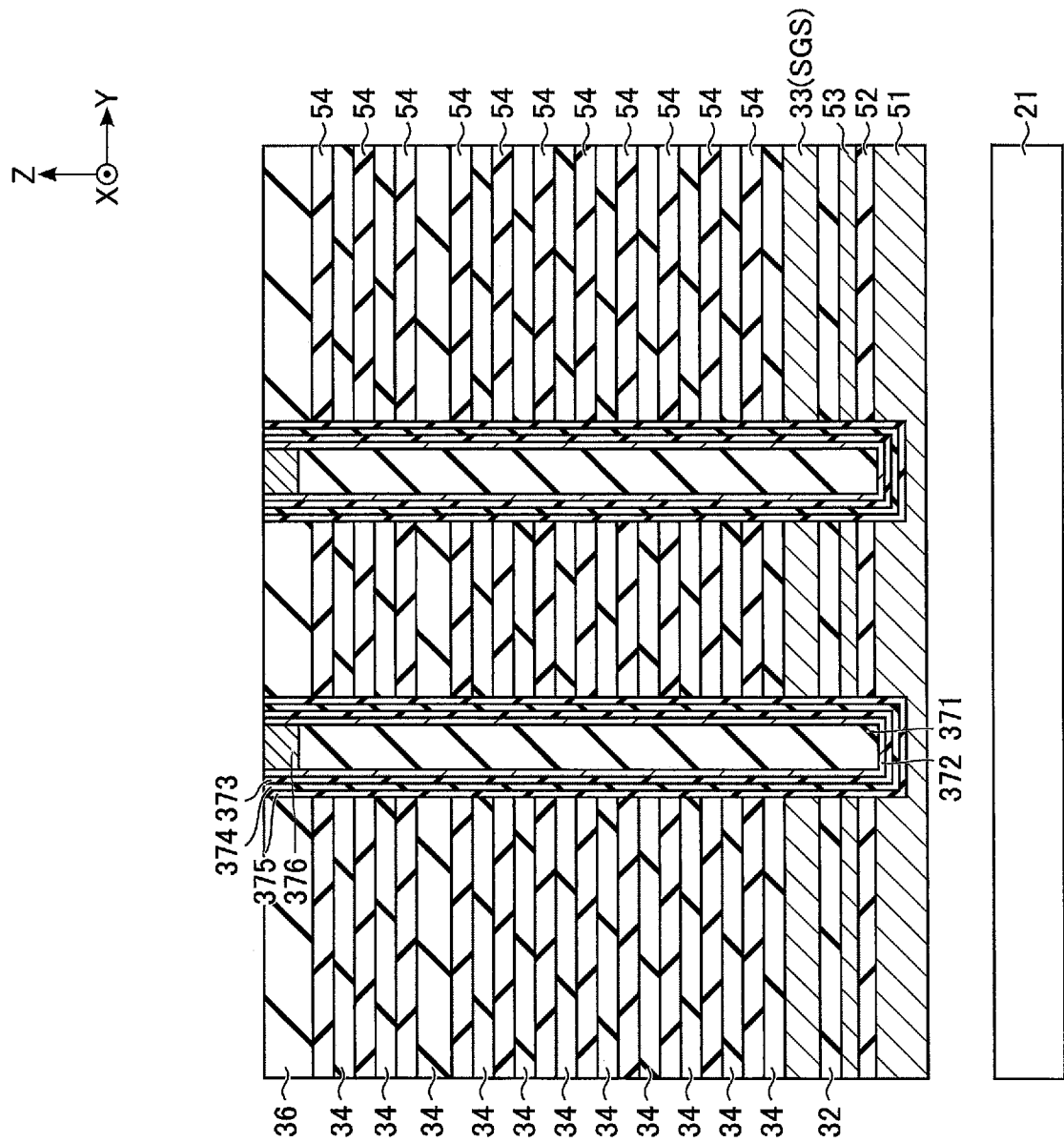

Thereafter, structures corresponding to memory pillars MP are formed, as illustrated in FIG. 6. Specifically, memory holes (not illustrated) are formed by, for example, anisotropic etching such as reactive ion etching (RIE). Each memory hole is formed so as to penetrate (pass through) the insulator 36, the alternately stacked replacement members 54 and insulators 34, the conductor 33, the insulator 32, the conductor 53, and the replacement member 52, and reach the conductor 51. A block insulating film 375, an insulating film 374, a tunnel oxide film 373, a semiconductor 372, a core member 371, and a semiconductor 376 are formed in the memory hole, and thereby a structure corresponding to a memory pillar MP is formed. Details will be described below.

First, a block insulating film 375, an insulating film 374, and a tunnel oxide film 373, for example, are sequentially formed in the memory hole. Subsequently, a semiconductor 372 is formed in the memory hole. Subsequently, a core member 371 is formed so as to fill in the memory hole in which the semiconductor 372 has been formed. After that, a portion of the core member 371 positioned above an upper surface of the uppermost replacement member 54 is partly removed. A semiconductor 376 is formed so as to fill in the portion from which the core member 371 has been partly removed. Thereby, a structure corresponding to a memory pillar MP is formed.

Figure 7:
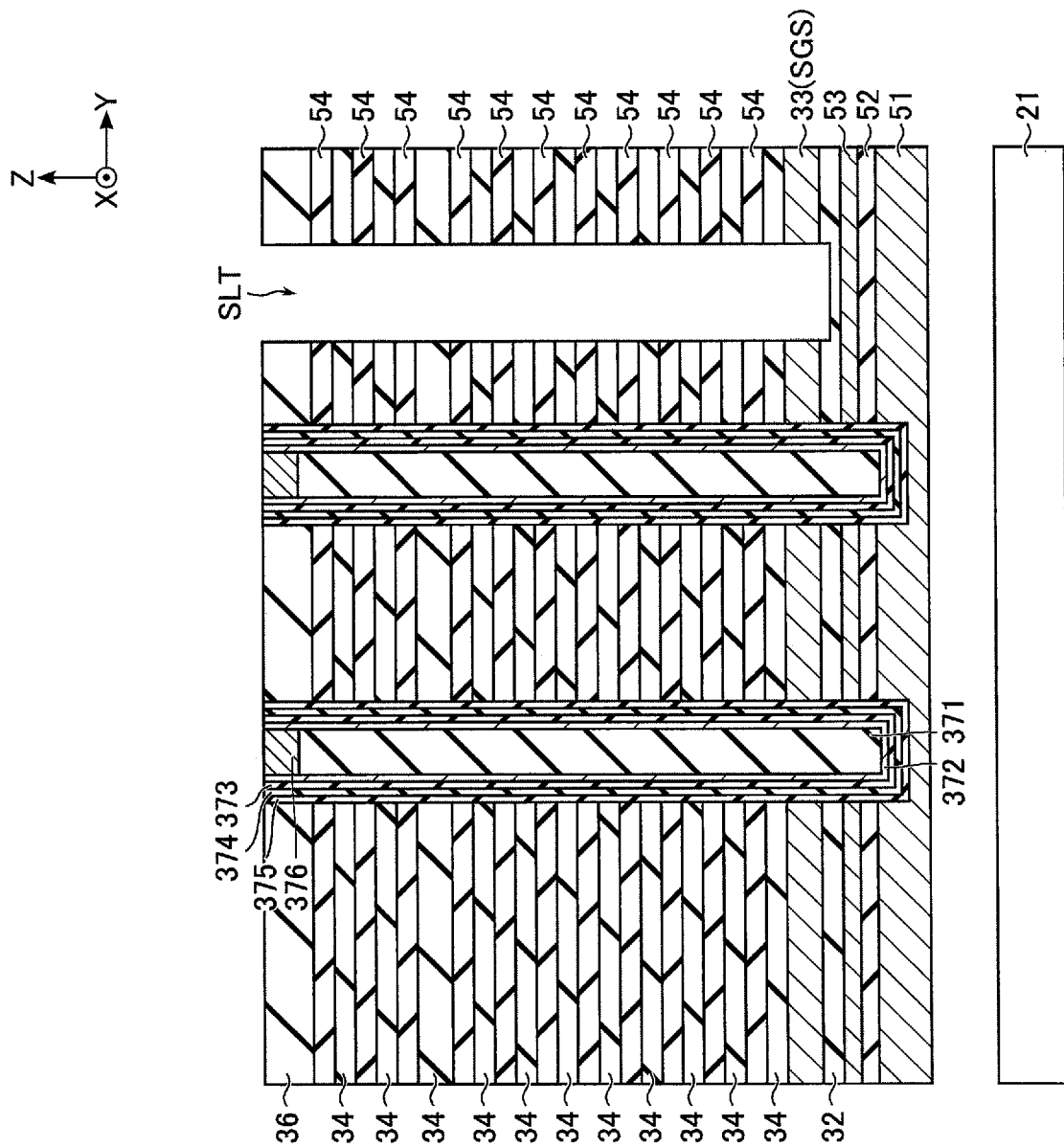

Thereafter, a slit SLT is formed by, for example, anisotropic etching such as RIE, as illustrated in FIG. 7. The slit SLT is formed so as to separate the insulator 36, the alternately stacked replacement members 54 and insulators 34, and the conductor 33, and reach the insulator 32.

Figure 8:
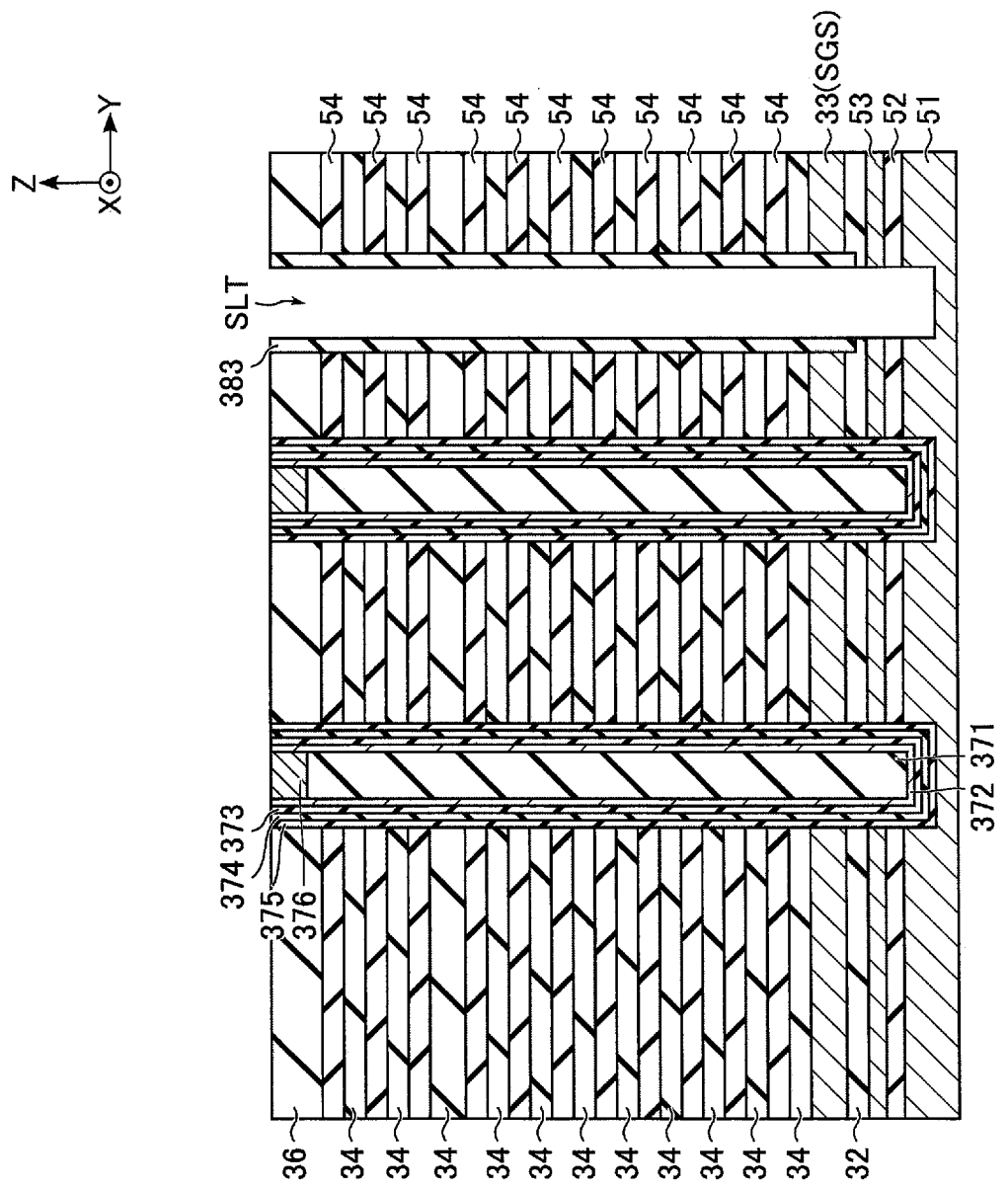

Thereafter, a nitride film 383 is formed in the slit SLT, as illustrated in FIG. 8. The nitride film 383 contains, for example, silicon nitride (SiN). Subsequently, a bottom portion of the slit SLT in which the nitride film 383 is formed is etched by, for example, anisotropic etching such as RIE. The etching is continued even after the nitride film 383 formed in the bottom portion of the slit SLT is removed. Consequently, the etched slit SLT penetrates the insulator 32, the conductor 53, and the replacement member 52, and the bottom portion of the etched slit SLT reaches the conductor 51, for example. The etched slit SLT reaches at least the replacement member 52.

Figure 9:
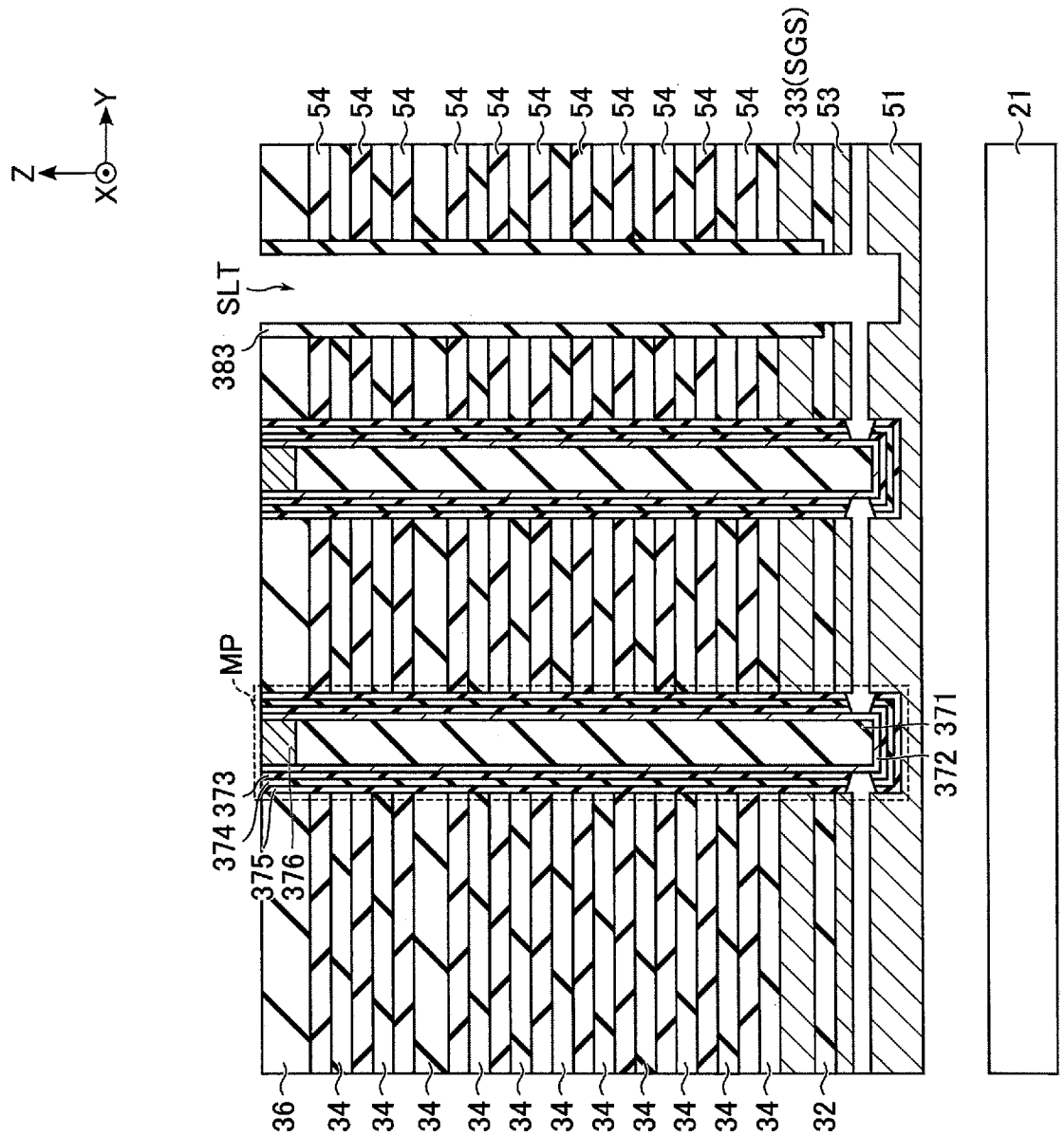

Thereafter, the replacement member 52 is selectively removed by wet etching via the slit SLT, as illustrated in FIG. 9. At this time, a portion of the side surface of the structure corresponding to a memory pillar MP that is in contact with the replacement member 52 is exposed. Subsequently, the block insulating film 375, the insulating film 374, and the tunnel oxide film 373 are partly removed on the exposed side surface by wet etching via a space from which the replacement member 52 is removed. In the portion from which the block insulating film 375, the insulating film 374, and the tunnel oxide film 373 have been partly removed, part of the side surface of the semiconductor 372 in the structure corresponding to a memory pillar MP is exposed. Thereby, a memory pillar MP is formed. In this wet etching, the nitride film is, for example, not removed.

Figure 10:
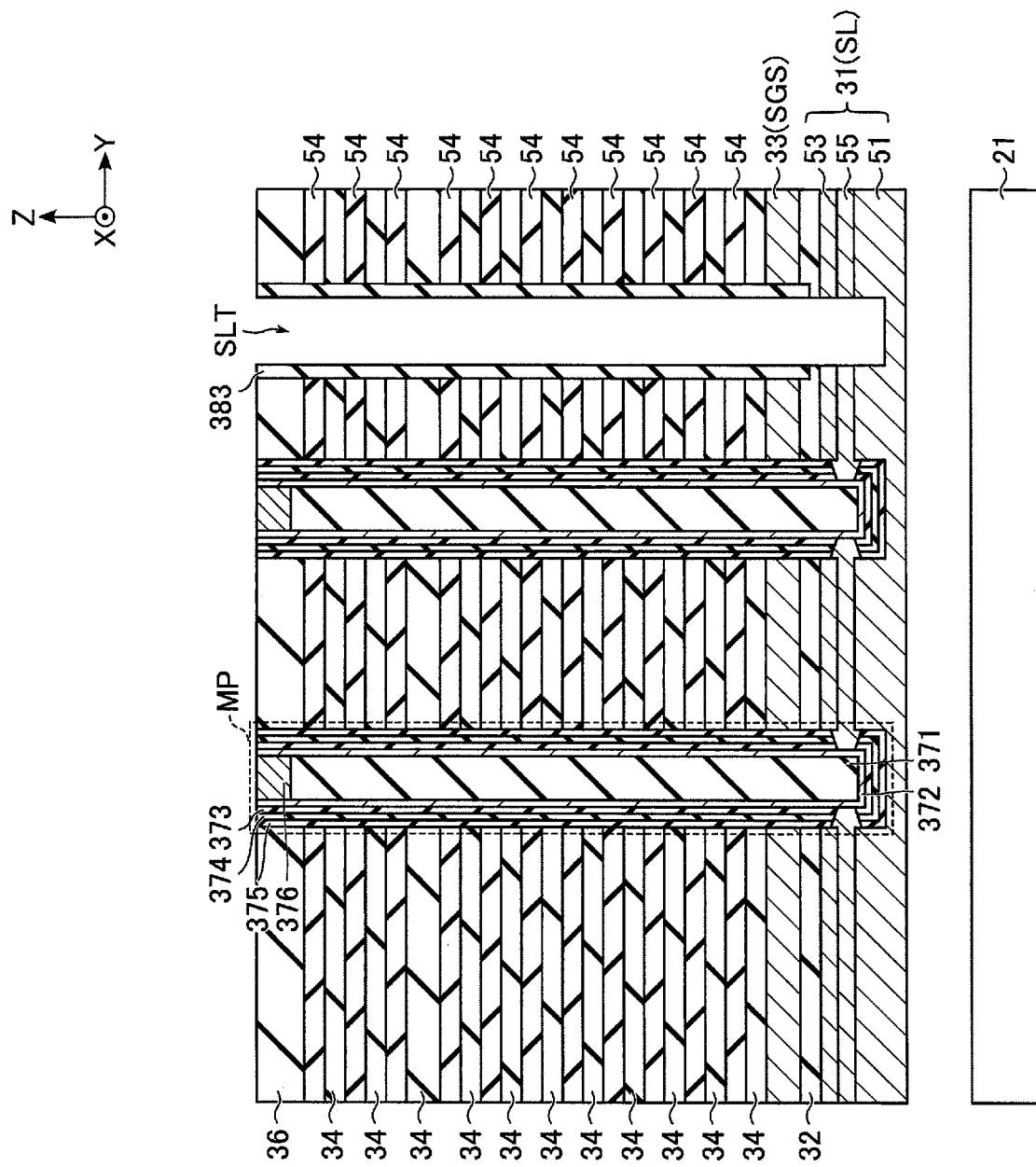

Thereafter, a conductor 55 is formed in the space from which the replacement member 52 has been removed and the space from which the block insulating film 375, the insulating film 374, and the tunnel oxide film 373 have been partly removed, as illustrated in FIG. 10. The conductor 55 contains, for example, polysilicon (Si). The conductor 55 formed in this manner corresponds to, in combination with the conductors 51 and 53, the conductor 31 illustrated in FIG. 4.

Figure 11:
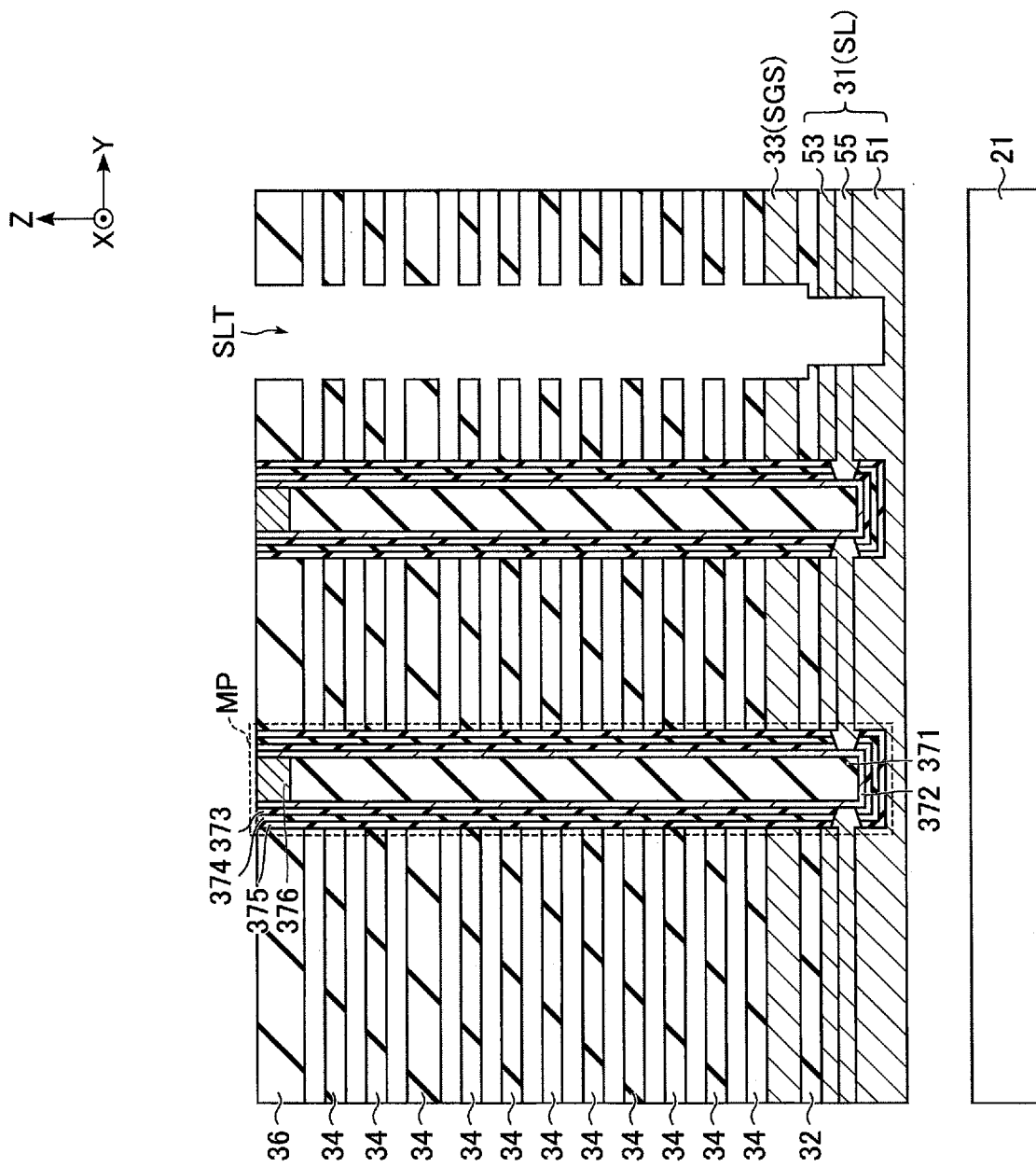

Thereafter, the nitride film 383 and the replacement members 54 are selectively removed by wet etching via the slit SLT, as illustrated in FIG. 11. Details will be described below.

First, surfaces of the conductors 51, 53, and 55 exposed in the slit SLT are selectively oxidized, and thereby an oxidized protective film (not illustrated) is formed. Subsequently, the nitride film 383 and the replacement members 54 are selectively removed by wet etching via the slit SLT.

The three-dimensional architecture of the structure obtained by the above-described steps is supported by, for example, the memory pillars MP.

Figure 12:
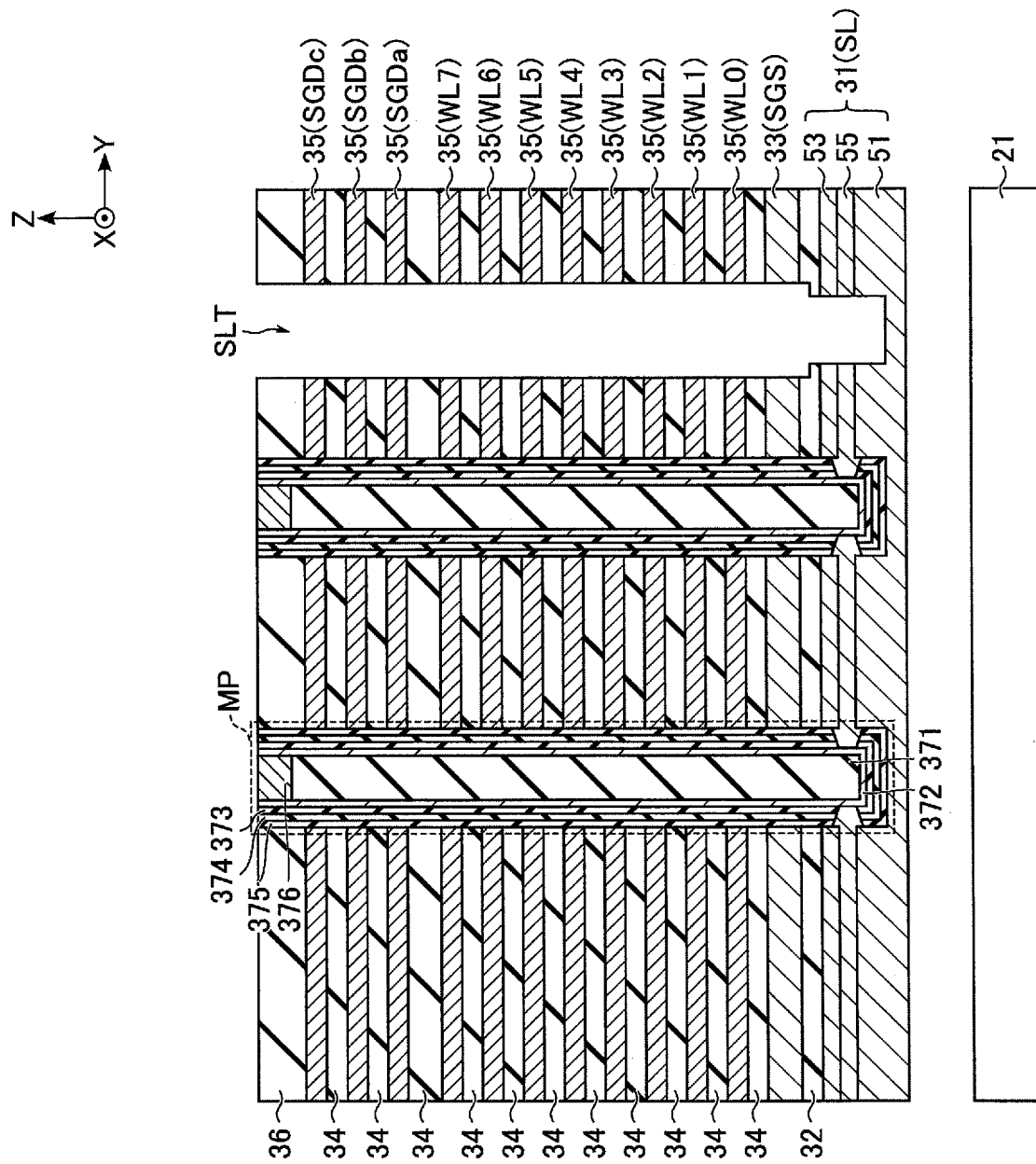

Thereafter, conductors are formed in the space from which the replacement members 54 have been removed, as illustrated in FIG. 12. The conductors are formed by, for example, a chemical vapor deposition (CVD) technique. The conductors formed in this manner correspond to the conductors 35 illustrated in FIG. 4.

Figure 13:
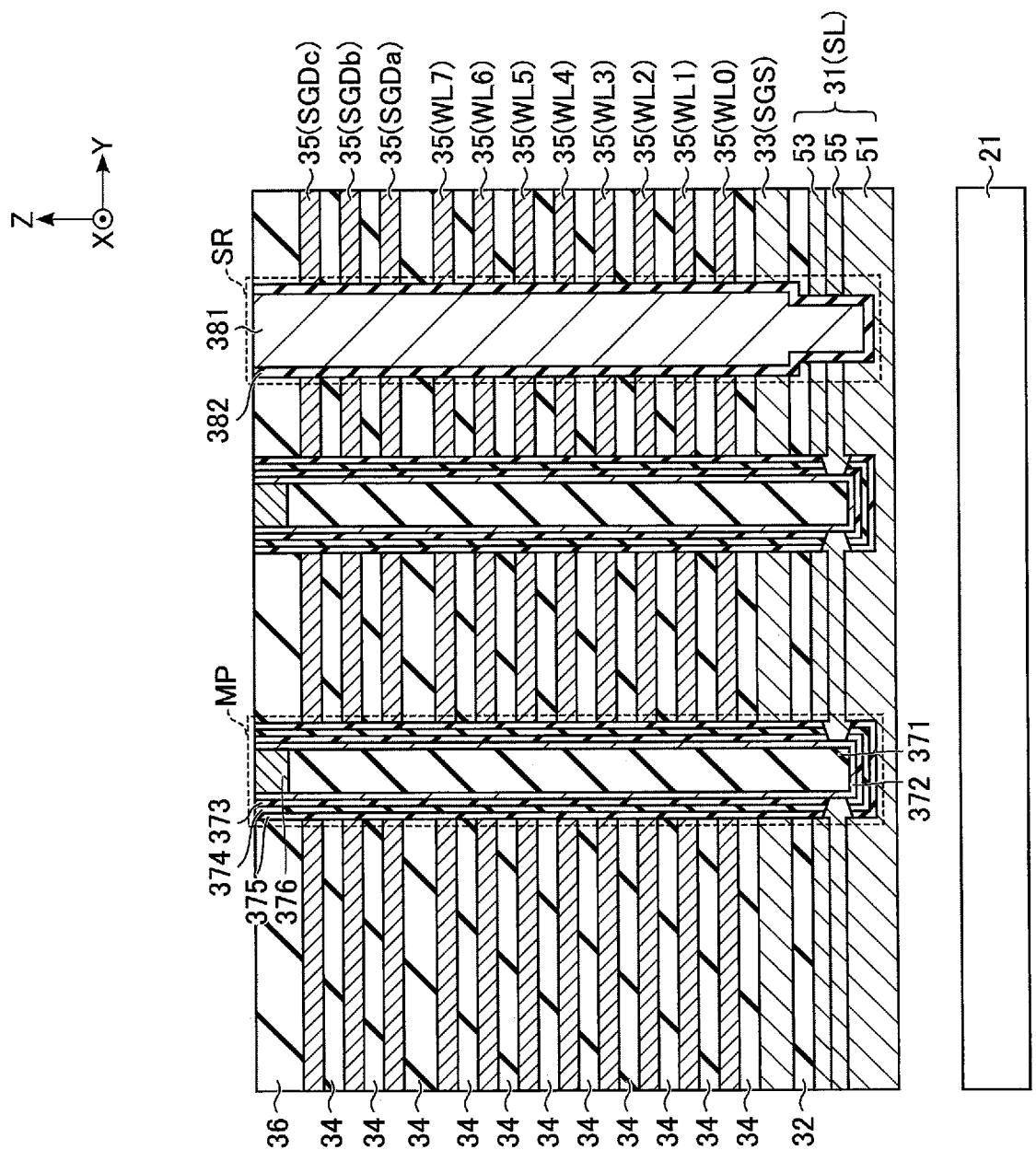

Thereafter, a first separation region SR is formed, as illustrated in FIG. 13. Details will be described below. First, an insulating film 382 is formed in the slit SLT. Subsequently, a conductor 381 is formed so as to fill in the slit SLT in which the insulating film 382 has been formed. The conductor 381 and the insulating film 382 correspond to the first separation region SR illustrated in FIG. 4.

Figure 14:
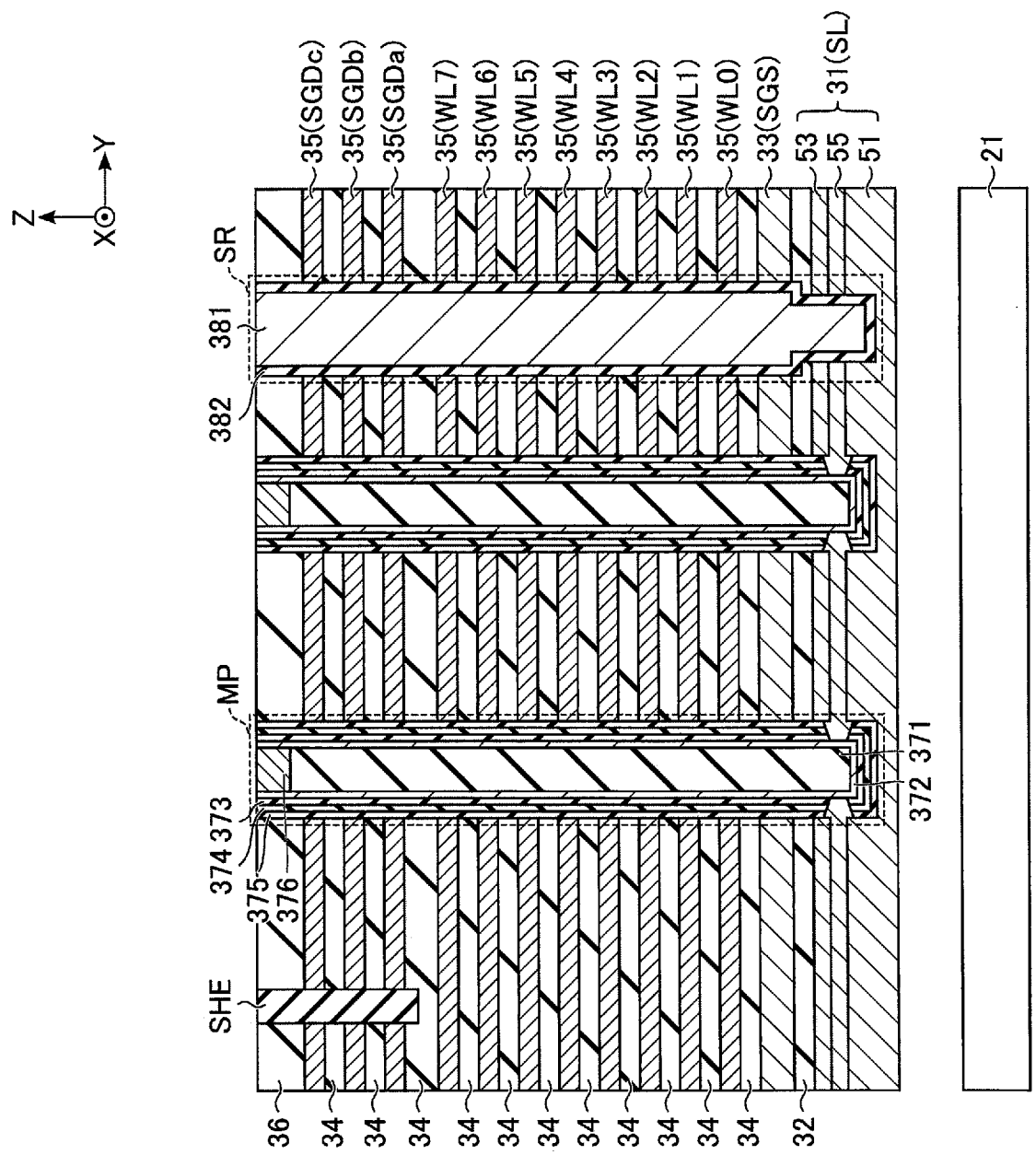

Thereafter, a second separation region SHE is formed, as illustrated in FIG. 14. Details will be described below. First, a slit (not illustrated) is formed by anisotropic etching such as RIE. The slit is formed so as to penetrate the insulator 36, first to third uppermost conductors 35, and insulators 34 interposed therebetween, and reach an insulator 34 that is in contact with a lower surface of the third uppermost conductor 35. Subsequently, an insulator is formed in the slit. The insulator formed in this manner corresponds to the second separation region SHE illustrated in FIG. 4.

In the structure manufactured in the above-described steps, the contact plug CP illustrated in FIG. 4 is formed. Details will be described below. An interlayer insulator 36 is formed on the entire surface of the structure obtained by the above-described steps. Subsequently, a contact hole (not illustrated) is formed by anisotropic etching such as RIE. The contact hole is formed so as to pass through the interlayer insulator 36 and reach the semiconductors 372 and 376 in the memory pillar MP. Subsequently, a conductor is formed in the contact hole. The conductor formed in this manner corresponds to the contact plug CP illustrated in FIG. 4. Thereafter, a conductor 41 is formed on an upper surface of the contact plug CP. A semiconductor memory device 1 is manufactured by, for example, providing coupling between the conductor 41 and another circuit component, etc.

Advantageous Effects

The formation of the conductors 35 described with reference to FIG. 12 is performed using, for example, a CVD technique that uses tungsten hexafluoride ($WF_6$) as a deposition gas. In the formation of the conductors 35, the space from which the replacement members 54 have been removed may not be completely filled with the conductors 35. In this case, a space in which a fluorine gas remains may be generated in the conductors 35, for example. Since fluorine has very high reactivity, the fluorine gas may erode an oxide film in the periphery thereof (hereinafter also referred to as an "F degas mode fault"), possibly causing a short circuit between word lines WL.

In a semiconductor memory device that utilizes an oxide film as a boundary between the blocks BLK, for example, the oxide film as the boundary between the blocks BLK is also eroded in the event of occurrence of an F degas mode fault, possibly affecting the adjacent block BLK.

A first separation region SR of the semiconductor memory device 1 is provided to extend in a planar shape along an xz plane, corresponding to the x and z directions, so as to separate the conductor 33 and the conductors 35, which respectively function as the select gate line SGS, the word lines WL0 to WL7, and the select gate line SGD. Such a first separation region SR functions as, for example, a boundary between the blocks BLK. The first separation region SR has a structure in which a conductor 381 is covered with an insulating film 382. The conductor 381 contains a metal such as tungsten (W) or titanium nitride (TiN).

In the event of occurrence of an F degas mode fault in the semiconductor memory device 1, the erosion by the fluorine gas is suppressed by the conductor 381 in the first separation region SR. In the semiconductor memory device 1, it is thus possible, in the event of occurrence of an F degas mode fault, to prevent the fault from affecting adjacent blocks BLK.

Moreover, the semiconductor memory device 1 is advantageous in that the deflective strength of the first separation region SR with the above-described structure is greater as compared to the case where, for example, only an insulator containing silicon oxide ($SiO_2$) is used as the separation region.

Second Embodiment

Hereinafter, a semiconductor memory device 1 according to the second embodiment will be described. In the description of the semiconductor memory device 1 according to the second embodiment, mainly the differences from the semiconductor memory device 1 according to the first embodiment will be focused on. The semiconductor memory device 1 according to the second embodiment produces the same advantageous effects as those described in the first embodiment.

Figure 15:
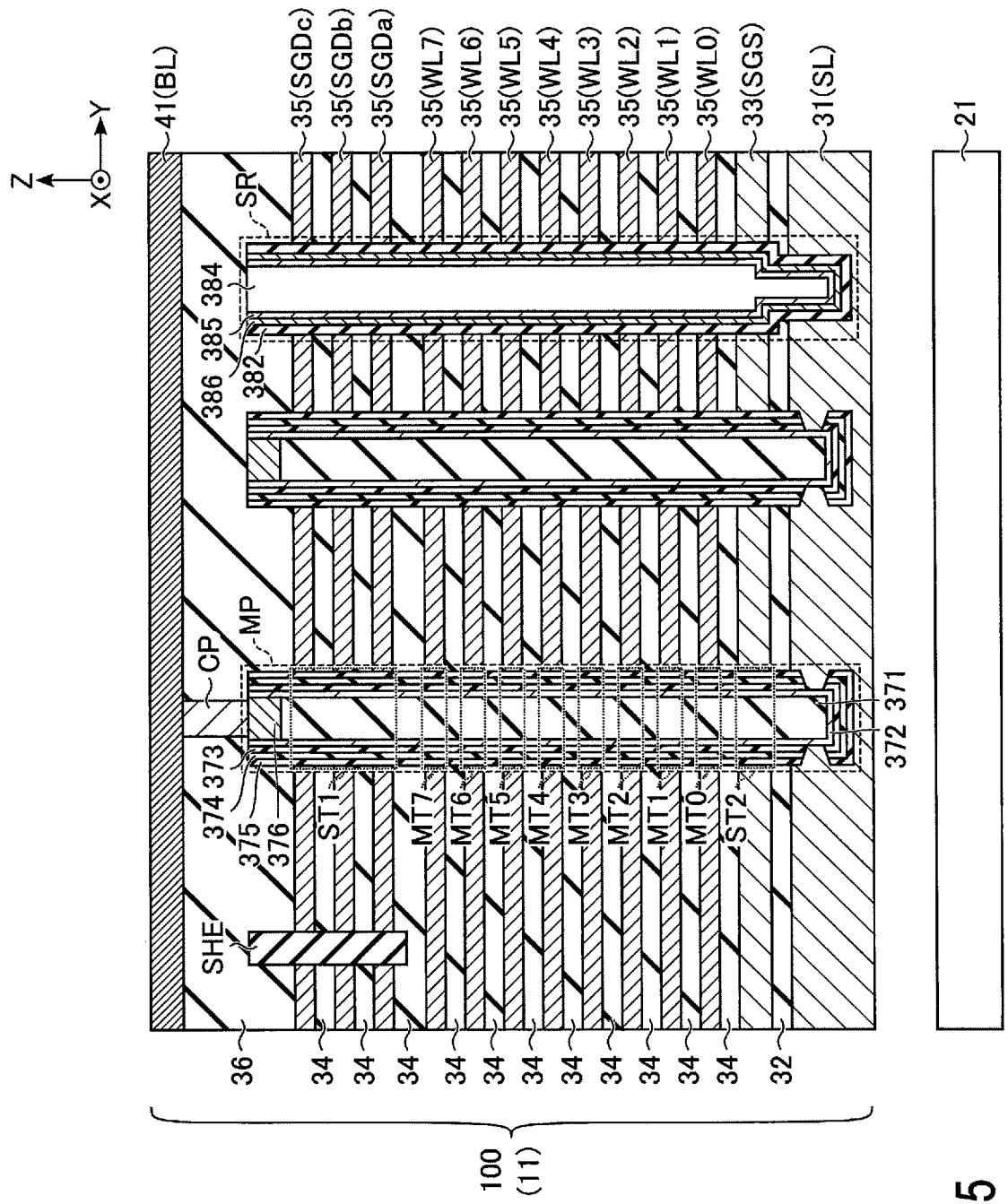
FIG. 15 is a cross-sectional view showing an example of a cross-sectional structure of a semiconductor memory device according to a second embodiment.

FIG. 15 is a cross-sectional view showing an example of a cross-sectional structure of the semiconductor memory device 1 according to the second embodiment. The cross-sectional view shown in FIG. 15 corresponds to the cross-sectional view of the semiconductor memory device 1 illustrated in FIG. 4 according to the first embodiment.

A semiconductor memory device 1 according to the second embodiment has a structure similar to the structure of the semiconductor memory device 1 according to the first embodiment, with a change made to the first separation region SR. A first separation region SR of the semiconductor memory device 1 according to the second embodiment will be described.

The first separation region SR includes, for example, a semiconductor 384, a conductor 385, a conductor 386, and an insulating film 382. An upper end of the semiconductor 384 is positioned, for example, above an upper surface of the uppermost conductor 35, and a lower end of the semiconductor 384 is positioned, for example, below a lower surface of the conductor 33. A conductor 385, a conductor 386, and an insulating film 382 are provided in this order on a side surface and a lower surface of the semiconductor 384. The semiconductor 384, the conductor 385, and the conductor 386 are insulated by the insulating film 382 from the conductor 31, the conductor 33, and the conductors 35. The semiconductor 384 contains, for example, polysilicon (Si). The conductor 385 contains, for example, titanium nitride (TiN). The conductor 386 contains, for example, titanium (Ti).

The steps of manufacturing the semiconductor memory device 1 according to the second embodiment are the same as those of the semiconductor memory device 1 according to the first embodiment, except for a partial change made to the formation of the first separation region SR described with reference to FIG. 13. That is, the first separation region SR of the semiconductor memory device 1 according to the second embodiment is formed as follows. First, an insulating film 382, a conductor 386, and a conductor 385 are sequentially formed in a slit SLT. Subsequently, a semiconductor 384 is formed so as to fill in the slit SLT. Thereby, the first separation region SR is formed.

Other Embodiments

In the above-described embodiments, a structure has been described, as an example, in which a tunnel oxide film, an insulating film, and a block insulating film are partly removed from a side surface of a memory pillar, allowing a semiconductor in a memory pillar to be in contact with a conductor that functions as a source line via the removed portion. However, a structure may be adopted in which, for example, a tunnel oxide film, an insulating film, and a block insulating film are partly removed from a lower surface of a memory pillar, allowing a semiconductor in a memory pillar to be in contact with a conductor that functions as a source line via the removed part.

In the above-described embodiments, each memory pillar may have a structure in which, for example, a plurality of pillars are coupled in the z direction. The memory pillars may be configured in such a manner that a pillar corresponding to select gate lines SGD and a pillar corresponding to word lines WL are coupled. The number of bit lines overlapping each memory pillar as viewed in the z direction may be designed to be any number.

In the above-described embodiments, the first separation region has been described as having a structure in which a conductor is covered with an insulating film. Similarly, the second separation region may have a structure in which, for example, a conductor is covered with an insulating film. One or both of such techniques may be adopted.

In the specification of the present application, the term "couple" refers to electrical coupling, and does not exclude, for example, intervention of another component.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first conductive layer;
a plurality of second conductive layers arranged at intervals in a first direction above the first conductive layer;
a first semiconductor layer extending in the first direction in the plurality of second conductive layers and being in contact with the first conductive layer;
a charge storage layer arranged between the first semiconductor layer and the plurality of second conductive layers;
a slit extending in the first direction through the plurality of second conductive layers and reaching the first conductive layer, extending in a second direction intersecting the first direction, and separating the plurality of second conductive layers in a third direction, the third direction intersecting the first direction and the second direction;

a first insulating layer provided on an inner side surface and an inner bottom surface of the slit; and a metal layer or a doped silicon layer filling an inside of the first insulating layer in the slit, wherein the metal layer or the doped silicon layer inside the slit is electrically insulated from the first conductive layer and the plurality of second conductive layers by the first insulating layer.

2. The device according to claim 1, wherein
the first insulating layer covers the metal layer or the doped silicon layer in the first conductive layer.

3. The device according to claim 1, wherein
an entirety of a portion of the metal layer or the doped silicon layer in the first conductive layer faces the first conductive layer via the first insulating layer.

4. The device according to claim 1, wherein
the metal layer contains tungsten.

5. The device according to claim 1, wherein
the metal layer contains titanium nitride.

6. The device according to claim 1, wherein
the metal layer contains titanium and titanium nitride.

7. The device according to claim 1, further comprising:
a second semiconductor layer extending in the first direction, wherein
the metal layer or the doped silicon layer is arranged between the first insulating layer and the second semiconductor layer.

8. The device according to claim 1, wherein
a lower end of the first insulating layer is below an upper surface of the first conductive layer.

9. The device according to claim 1, wherein
a lower end of the metal layer or the doped silicon layer is below an upper surface of the first conductive layer.

10. The device according to claim 1, further comprising:
a semiconductor substrate arranged below the first conductive layer.

11. The device according to claim 1, wherein
the second conductive layers include a first set of second conductive layers and a second set of second conductive layers arranged above the first set,
the semiconductor memory device further comprises a second insulating layer extending in the first direction and the second direction above the first set and separating the second set of second conductive layers in the third direction, and
a lower end of the second insulating layer is above the first set.

12. The device according to claim 1, wherein
the device is a NAND flash memory.

13. The device according to claim 1, wherein
the doped silicon layer contains polysilicon.

14. A semiconductor memory device, comprising:
a first conductive layer;
a plurality of second conductive layers arranged at intervals in a first direction above the first conductive layer;
a first semiconductor layer extending in the first direction in the plurality of second conductive layers and being in contact with the first conductive layer;
a first charge storage layer between the first semiconductor layer and the plurality of second conductive layers;
a plurality of third conductive layers arranged at intervals in the first direction above the first conductive layer, the plurality of second conductive layers and the plurality of third conductive layers being arranged at intervals in a second direction intersecting the first direction,
a second semiconductor layer extending in the first direction in the plurality of third conductive layers and being in contact with the first conductive layer;
a second charge storage layer between the second semiconductor layer and the plurality of third conductive layers;
a slit extending in the first direction and reaching the first conductive layer, extending in a third direction intersecting the first direction and the second direction, between the plurality of second conductive layers and the plurality of third conductive layers;
an insulating layer provided on an inner side surface and an inner bottom surface of the slit; and
a metal layer or a doped silicon layer filling an inside of the insulating layer in the slit, wherein
the metal layer or the doped silicon layer inside the slit is electrically insulated from the first conductive layer, the plurality of second conductive layers and the plurality of third conductive layers by the insulating layer.

15. The device according to claim 14, wherein
a lower end of the metal layer or the doped silicon layer is below an upper surface of the first conductive layer, and an upper end of the metal layer or the doped silicon layer is above the second conductive layers and the third conductive layers.

16. The device according to claim 14, wherein
the doped silicon layer contains polysilicon.

* * * * *